United States Patent
Tanaka

(10) Patent No.: US 7,294,874 B2
(45) Date of Patent: Nov. 13, 2007

(54) LASER IRRADIATION METHOD, METHOD FOR MANUFACTURING A SEMICONDUCTOR DEVICE, AND A SEMICONDUCTOR DEVICE

(75) Inventor: Koichiro Tanaka, Kanagawa (JP)

(73) Assignee: Semiconductor Energy Laboratory Co., Ltd., Kanagawa-ken (JP)

(*) Notice: Subject to any disclaimer, the term of this patent is extended or adjusted under 35 U.S.C. 154(b) by 304 days.

(21) Appl. No.: 10/911,476

(22) Filed: Aug. 5, 2004

(65) Prior Publication Data

US 2005/0037553 A1 Feb. 17, 2005

(30) Foreign Application Priority Data

Aug. 15, 2003 (JP) .............................. 2003-293897

(51) Int. Cl.
*H01L 27/148* (2006.01)

(52) U.S. Cl. ...................... 257/228; 257/257; 257/290; 438/16

(58) Field of Classification Search ................ 438/14, 438/16, 378, 487; 356/625; 257/228, 257, 257/290, 414, 431
See application file for complete search history.

(56) References Cited

U.S. PATENT DOCUMENTS

| 3,585,088 A | 6/1971 | Schwuttke et al. |
|---|---|---|
| 5,308,998 A | 5/1994 | Yamazaki et al. |
| 5,643,826 A | 7/1997 | Ohtani et al. |
| 5,913,112 A | 6/1999 | Yamazaki et al. |
| 5,923,962 A | 7/1999 | Ohtani et al. |
| 5,962,870 A | 10/1999 | Yamazaki et al. |
| 6,285,042 B1 | 9/2001 | Ohtani et al. |
| 6,331,723 B1 | 12/2001 | Yamazaki et al. |
| 6,426,245 B1 | 7/2002 | Kawasaki et al. |
| 6,489,222 B2 | 12/2002 | Yoshimoto |
| 6,567,219 B1 | 5/2003 | Tanaka |
| 6,599,788 B1 | 7/2003 | Kawasaki et al. |
| 6,660,609 B2 | 12/2003 | Tanaka |
| 2001/0010702 A1 | 8/2001 | Tanaka |
| 2001/0015441 A1 | 8/2001 | Kawasaki et al. |
| 2001/0055830 A1 | 12/2001 | Yoshimoto |
| 2002/0017685 A1 | 2/2002 | Kasahara et al. |
| 2002/0024047 A1 | 2/2002 | Yamazaki et al. |
| 2002/0094008 A1 | 7/2002 | Tanaka |
| 2002/0094613 A1 | 7/2002 | Yamazaki et al. |
| 2003/0024905 A1 | 2/2003 | Tanaka |
| 2003/0038122 A1 | 2/2003 | Yamazaki |
| 2003/0086182 A1 | 5/2003 | Tanaka et al. |
| 2003/0143337 A1 | 7/2003 | Tanaka |
| 2003/0168437 A1 | 9/2003 | Tanaka |

FOREIGN PATENT DOCUMENTS

JP 9-102468 4/1997

*Primary Examiner*—Hsien-Ming Lee
(74) *Attorney, Agent, or Firm*—Nixon Peabody LLP; Jeffrey Costellia

(57) ABSTRACT

The present invention discloses the semiconductor device having the substrate that reflects the laser beam on a surface; that absorbs the laser beam therein; or that partially reflects the laser beam on the surface and partially absorbs the laser beam in the laser annealing. Moreover, the substrate has a poly-crystalline semiconductor film having a large grain size. The present invention suppresses the effect due to the reflected light from a rear surface of the substrate and therefore the uniform laser annealing can be performed.

17 Claims, 7 Drawing Sheets

LASER IRRADIATION METHOD, METHOD FOR MANUFACTURING A SEMICONDUCTOR DEVICE, AND A SEMICONDUCTOR DEVICE

BACKGROUND OF THE INVENTION

1. Field of the Invention

The present invention relates to a semiconductor device where an element such as a transistor is formed using a semiconductor film formed over a substrate. Moreover, the present invention relates to a laser irradiation method for annealing the semiconductor film for example. Furthermore, the present invention relates to a method for manufacturing a semiconductor device including the laser irradiation in its step.

2. Related Art

In recent years, a technique to form a thin film transistor (hereinafter referred to as a TFT) over a substrate has made great progress and application development to an active matrix display device has been advanced. Particularly, TFTs formed using poly-crystalline semiconductor films are superior in field-effect mobility to TFTs formed using conventional amorphous semiconductor films, and therefore high-speed operation becomes possible. For this reason, a circuit for driving pixels, which has been mounted on an external IC chip, can be formed integrally with the pixels over the same substrate using TFTs.

The poly-crystalline semiconductor film suitable for manufacturing a TFT is obtained by crystallizing an amorphous semiconductor film. To crystallize the amorphous semiconductor film, a laser annealing method is generally employed. The laser annealing is more preferable than a general thermal annealing that requires a temperature as high as 600° C. or more. This is because an inexpensive glass substrate is inferior in heat resistance and is easy to change in shape due to the heat. That is to say, the laser annealing has advantages that the processing time can be shortened to a large degree compared with another annealing method using radiation heat or conduction heat, and that a semiconductor substrate or a semiconductor film on a substrate can be heated selectively and locally so that the substrate is hardly damaged thermally. Therefore, the laser annealing method is widely used to crystallize the amorphous semiconductor film formed over the glass substrate.

It is noted that the laser annealing method described herein includes the technique to recrystallize an amorphous layer or a damaged layer formed in the semiconductor substrate or the semiconductor film, and the technique to crystallize an amorphous semiconductor film formed over the substrate. In addition, the technique to planarize, modify the surface of the semiconductor substrate and the semiconductor film are also included.

Laser oscillators are classified broadly into two kinds, which are a pulsed laser oscillator and a continuous wave laser oscillator, in a standpoint of the oscillation method. In recent years, it has been known that the continuous wave (hereinafter referred to as CW for short) laser oscillator such as an Ar laser and a $YVO_4$ laser can enlarge a crystal grain size formed in the semiconductor film compared with the pulsed laser oscillator such as an excimer laser. The CW laser beam used in the laser annealing has a wavelength in the visible region that is sufficiently absorbed in the amorphous semiconductor film, and that is easily obtained from the laser oscillator. When the crystal grain in the semiconductor film becomes larger, the number of grain boundaries in a channel-forming region of a TFT formed using the semiconductor film decreases. Therefore, the mobility becomes so high that this semiconductor film can be used to develop a more sophisticated device. For this reason, attention has been paid to the technique for crystallizing the semiconductor film using the CW laser oscillator.

However, when the laser annealing is performed using the CW laser oscillator, there is a problem that the annealing is not performed uniformly to a semiconductor film. This is because the laser beam emitted from the laser oscillator has Gaussian intensity distribution where the intensity decreases from the center toward the edge. Thus, it is difficult to anneal the semiconductor film uniformly.

SUMMARY OF THE INVENTION

The present invention is made in view of the above problem, and it is an object of the present invention to provide a laser irradiation method that can perform the laser processing such as laser annealing uniformly to a processing object such as a semiconductor film formed over the substrate. It is also an object of the present invention to provide a method for manufacturing a semiconductor device using the laser irradiation method. Furthermore, it is an object of the present invention to provide a semiconductor device manufactured by the above manufacturing method.

In manufacturing a semiconductor device, the laser annealing is performed in such a way that a glass substrate is used as the substrate, that a semiconductor film formed over the substrate is used as the irradiated surface, and that a visible laser beam is made incident vertically into the irradiated surface, for example. In this laser annealing, since the visible light is not absorbed in the glass substrate that much, the laser beam incident into a first surface of a substrate (this laser beam is hereinafter referred to as incident light) transmits through the glass substrate and reaches a second surface of the substrate. The first surface herein means the surface of the substrate where the semiconductor film is formed and where the laser beam is incident. And the second surface herein means a surface opposite to the first surface. Then, the laser beam reflects on the second surface of the substrate, and this reflected laser beam (hereinafter referred to as a reflected light) is incident into the semiconductor film again. On this occasion, since the reflected light from the second surface of the substrate is incident into the semiconductor film heated and melted by the incident light, the reflected light form the second surface interferes with the incident light on the semiconductor film. The interference makes different regions on the semiconductor film. One of them is a region where the laser beams are reinforced and other is a region where the laser beams are attenuated each other. It has become clear that such regions cause the variation in the state of the semiconductor film annealed by the laser beam.

In order to prevent such an effect due to the interference, the present invention uses a substrate that reflects the laser beam on a first surface; that absorbs the laser beam therein; or that partially reflects the laser beam on the first surface and partially absorbs the laser beam therein in accordance with the wavelength of the laser beam to be irradiated in the laser processing such as the laser annealing.

The present invention discloses a semiconductor device in which the crystalline semiconductor film is formed over a first surface of the substrate. The substrate in the semiconductor device has a characteristic that light that is partially absorbed in the semiconductor film and that becomes transmitted light reaching the first surface of the substrate is reflected on the first surface of the substrate; is absorbed therein; or is partially reflected on the first surface and partially absorbed therein. With the substrate having such a characteristic, the reflected light from the second surface does not affect the uniformity of the annealing when the intensity of the reflected light from the second surface of the substrate is less than the threshold at which the intensity of the reflected light from the second surface affects the state of the semiconductor film to be annealed. Therefore, when the light having uniform intensity distribution is used, the semiconductor film can be annealed uniformly without being affected by the reflected light from the second surface. In order to form a crystal having a large grain size, it is preferable to use a CW laser oscillator emitting a visible wavelength such as a second harmonic of a solid-state laser because the second harmonic has higher energy efficiency than the other higher harmonics. Therefore, when the laser annealing is performed using such a laser, a region including poly-crystals each having a large grain size (this region is hereinafter referred to as a large crystal grain region) can be formed efficiently all over the substrate. In other words, the present invention provides a semiconductor device having a substrate that has the large crystal grain region over the first surface and that does not transmit the light having a particular wavelength region.

In the present invention, when the substrate is assumed to have a thickness of d, it is preferable that the absorption coefficient α of the substrate to the laser beam satisfies the inequality of $\alpha \geq \ln 10/2d$. In fact, the reflectivity of the second surface of the substrate is approximately 4%, and this prevents the semiconductor film from being annealed uniformly. According to the experiment of the present inventor, it has been confirmed that the effect due to the reflected light from the second surface can be eliminated by making the reflectivity 0.4%. Therefore, it is considered that the effect due to the interference can be eliminated when the intensity of the laser beam becomes $1/10$ while the light beam travels twice as long as the thickness of the substrate (the distance of 2d), and thus the above inequality is derived. In the above inequality, the absorption coefficient α is assumed to be the minimum when $I=I_0/10$ is satisfied where I is the intensity of the laser beam after the incident light having an intensity of $I_0$ travels the distance 2d in the medium having an absorption coefficient of α (the intensity of the reflected light from the second surface of the substrate at the first surface of the substrate). When the absorption coefficient α of the substrate satisfies this inequality, the intensity of the reflected light from the second surface of the substrate is less than the threshold at which the intensity of the reflected light affects the state of the semiconductor film to be annealed. Therefore, the annealing can be performed without considering the effect of the reflected light from the second surface of the substrate.

The substrate made of glass used for manufacturing TFT thereover available in the market has a thickness from approximately 0.5 to 1.1 mm. In consideration of this thickness, the absorption coefficient α at which the intensity of the reflected light from the second surface of the substrate having a thickness of 1.1 mm does not affect the state of the semiconductor film to be annealed is approximately 1/mm according to the above inequality. Thus, with respect to the thinner substrate, the absorption coefficient α needs to be 1/mm or more in order for the reflected light from the second surface of the substrate not to affect the state of the semiconductor film to be annealed. Thus, the absorption coefficient α of the substrate to the laser beam is 1/mm or more in the present invention.

The substrate disclosed in the present invention is opaque to the laser beam to be irradiated. That the substrate is opaque to the laser beam means that the transmittance of the laser beam is small. In other words, the reflected light is not produced at the second surface of the substrate. This can prevent the reflected light from the second surface from interfering with the incident light on the semiconductor film and the uniformity of the annealing is not affected. In particular, when a CW laser oscillator having a wavelength in the visible region such as a second harmonic (532 nm) of a YVO$_4$ laser is used to perform the laser annealing, the substrate is preferably opaque to the visible light. For example, an insulating substrate such as a colored glass substrate or a ceramic substrate can be used.

In the present invention, with the substrate having such a characteristic, it is possible to obtain the poly-crystalline semiconductor film formed over the substrate in which the crystal grain extends long in one direction and has a length of 600 nm or more in a direction scanned by the laser beam.

The present invention discloses a laser irradiation method including the steps of homogenizing intensity distribution of a laser beam emitted from a laser oscillator by an optical system, and irradiating the laser beam vertically to a substrate with a thin film having a light-absorption characteristic such as a semiconductor film formed thereover, wherein the laser beam reflects on the first surface of the substrate; or the laser beam is absorbed in the substrate; or the laser beam is partially reflected on the first surface thereof and partially absorbed therein, and wherein the laser beam moves back and forth relative to the substrate.

In the present invention, it is preferable that an absorption coefficient α of the substrate to the laser beam satisfies an inequality of $\alpha \geq \ln 10/2d$ where d is the thickness of the substrate. Considering that the substrate available in the market has a thickness from approximately 0.5 to 1.1 mm, the absorption coefficient α of the substrate is preferably 1/mm or more.

In the present invention, the laser beam can be made incident into the substrate vertically. This is because the substrate used in the present invention reflects the laser beam on the first surface; absorbs the laser beam therein; or partially reflects on the first surface and partially absorbs the laser beam, and therefore it is not necessary to consider the effect due to the reflected light from the second surface of the substrate.

In the present invention, the laser oscillator is one or a plurality of lasers selected from the group consisting of a YVO$_4$ laser, a YLF laser, an Ar laser, an excimer laser, a YAG laser, and a glass laser.

In the present invention, when a CW laser oscillator having a wavelength in the visible region such as a second harmonic of a YVO$_4$ laser (532 nm) is used in the laser annealing, it is preferable that the substrate is opaque to the visible light. For example, an insulating substrate such as a colored glass substrate or a ceramic substrate can be used. Since the reflected light from the second surface of the substrate is not produced by using the opaque substrate, the laser annealing can be performed without considering the effect of the reflected light from the second surface of the substrate. Moreover, since the reflected light from the second surface of the substrate does not have any affects, the laser beam can be made incident vertically. Therefore, the state of the entire semiconductor film annealed by scanning the laser beam can be same not depending on the direction of the scanning the laser beam.

The present invention discloses a method for manufacturing a semiconductor device comprising the steps of forming a semiconductor film over a substrate, and performing laser annealing in such a way that a laser beam emitted from a laser oscillator whose intensity distribution is homogenized by an optical system is irradiated vertically to the substrate as an irradiated surface, wherein the substrate reflects the laser beam on the first surface of the substrate; the substrate absorbs the laser beam in the substrate; or the substrate partially reflects the laser beam on the first surface thereof and partially absorbs the laser beam therein, and wherein the laser beam moves back and forth relative to the substrate.

In the present invention, it is preferable to use the substrate having an absorption coefficient $\alpha$ to the laser beam that satisfies the inequality of $\alpha \geq \ln 10/2d$ where d is the thickness of the substrate. It is more preferable that the absorption coefficient $\alpha$ is 1/mm or more.

The laser oscillator is one or a plurality of lasers selected from the group consisting of a $YVO_4$ laser, a YLF laser, an Ar laser, an excimer laser, a YAG laser, and a glass laser.

When the CW laser oscillator having a wavelength in the visible region such as a second harmonic of a $YVO_4$ laser (532 nm) is used to perform the laser annealing, the substrate is preferably opaque to the visible light. For example, an insulating substrate such as a colored glass substrate or a ceramic substrate can be used.

[Advantageous Effect of the Invention]

When the laser annealing is performed according to the present invention, the laser beam is reflected on the first surface of the substrate; or the laser beam is absorbed in the substrate; or the laser beam is partially reflected on the first surface thereof and partially absorbed therein. Therefore, when the reflected light from the second surface of the substrate has the intensity lower than the threshold at which the intensity of the reflected light affects the state of the semiconductor film to be annealed, the uniformity of the annealing can be improved. And, when the substrate opaque to the laser beam is used in the laser annealing, the transmittance of the laser beam becomes small. Therefore, when the laser beam is incident into the substrate, the incident light does not reach the second surface of the substrate, thereby not producing the reflected light from the second surface of the substrate. For this reason, the uniformity of the annealing can be improved, and it is no longer necessary to consider the effect of the reflected light from the second surface of the substrate in the laser annealing.

Moreover, the effect of the reflected light from the second surface of the substrate can be suppressed with the laser beam can be made incident vertically into the semiconductor film. When the laser beam can be incident vertically, the optical design can have large degree of freedom. For example, a beam homogenizer such as a diffractive optic can be used to form a laser beam having uniform intensity distribution easily. In addition, according to the present invention, the reflected light from the second surface of the substrate hardly affects or does not affect at all even though the laser beam having the uniform intensity distribution is incident vertically into the substrate. Therefore, uniformity of the crystallinity of the semiconductor film annealed by the laser beam can be considerably improved. On this occasion, when the CW laser oscillator having a wavelength in the visible region such as an emission wavelength of an Ar laser or a second harmonic of a $YVO_4$ laser is used, the whole surface of the semiconductor film can be crystallized to obtain a large crystal grain region in a comparatively short period of time because the energy absorption coefficient is higher than the other wavelengthes. In addition, when TFTs are manufactured using the semiconductor film, the mobility increases remarkably compared with TFTs that manufactured using the conventional crystalline semiconductor film. Therefore, the TFT manufactured by the present invention can be also used to the semiconductor device requiring the high-speed operation.

Moreover, since the present invention can make the laser beam incident into the substrate vertically, the semiconductor film can be annealed uniformly not depending on the scanning direction. The same large crystal grain region can be obtained by scanning the laser beam back and forth, thereby being able to process many substrates in a short period of time. That is to say, an advantage of high throughput can be obtained.

DETAILED DESCRIPTION OF THE INVENTION

Hereinafter, embodiment modes and embodiments of the present invention are explained based on drawings. However, since the present invention can be embodied in many different modes, it is easily understood by those skilled in the art that the modes and the details of the present invention can be changed and modified in various ways unless such changes and modifications depart from the scope and the content of the present invention hereinafter defined. Thus, the present invention is not limited to the description of the embodiment modes.

Embodiment Mode 1

Figure 1:
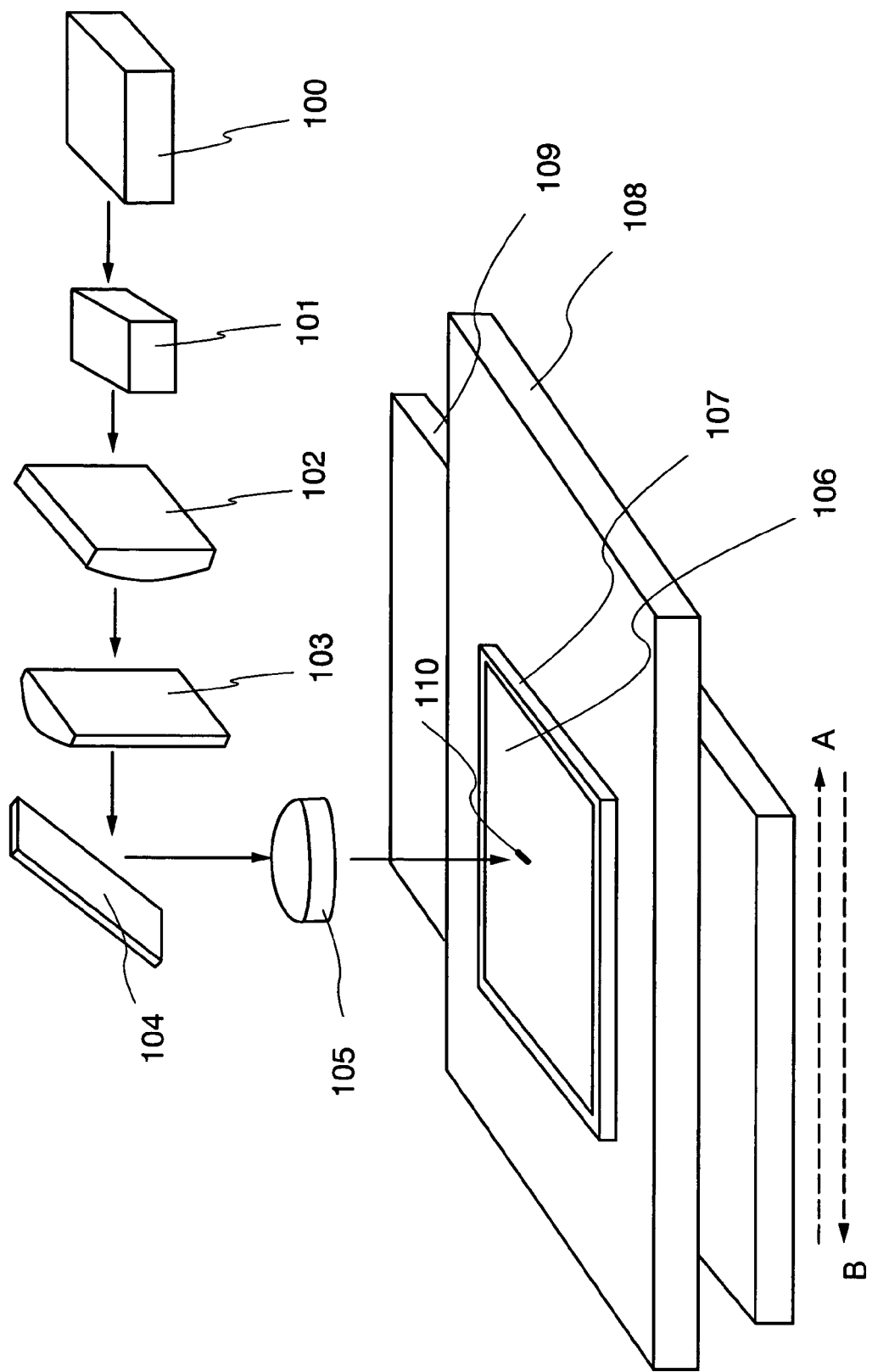
FIG. 1 is a drawing for explaining the laser irradiation method of the present invention.

The embodiment mode 1 of the present invention is explained in detail with reference to FIGS. 1 and 3.

Initially, impurities are mixed into a glass substrate to form a colored glass substrate that is opaque to the visible light. Then, an amorphous semiconductor film or a non-single crystal semiconductor film is formed over the colored glass substrate, and the laser annealing is performed to the colored glass substrate as the irradiated surface. It is noted that not only the colored glass substrate, but also another substrate such as a ceramic substrate made of the material that is opaque to the laser beam to be irradiated and that can resist the heat in the laser annealing can be used as the substrate.

Next, a laser irradiation method is explained with reference to FIG. 1. In FIG. 1, the laser beam propagates in a direction indicated by arrows of continuous lines. A laser oscillator 100 is a $YVO_4$ laser emitting a second harmonic light. The laser oscillator is not limited to the $YVO_4$ laser in the present invention. As the laser oscillator 100, one or a plurality of lasers selected from the group consisting of a $YVO_4$ laser, a YLF laser, an Ar laser, a YAG laser, an excimer laser, and a glass laser can be used. Although the excimer laser apparatus and the glass laser apparatus emit pulsed lasers, the pulsed laser can also provide advantageous effects of the present invention. After that, a rectangular beam having uniform intensity distribution is formed using a diffractive optic 101 as the beam homogenizer. And, the lengths of the rectangular laser beam in the directions of the major and minor axes are adjusted using convex cylindrical lenses 102 and 103, thereby forming the rectangular laser beam having the desired aspect ratio. Then, after reflecting it by a mirror 104, the size of the rectangular beam is adjusted by a condenser lens 105. Finally, the laser beam is incident into an opaque glass substrate 107 with an amorphous semiconductor film 106 formed thereover. It is noted that the laser beam condensed by the condenser lens 105 is incident vertically into the glass substrate 107. In addition, as the moving stage for moving the substrate, an X-axis stage 108 and a Y-axis stage 109 are used.

Although the laser beam is incident vertically into the glass substrate 107, the laser beam does not transmit through the glass substrate 107 because the glass substrate 107 is the colored glass substrate that is opaque to the visible light. Therefore, the laser beam does not reach the second surface of the glass substrate 107, and the reflected light from the second surface of the glass substrate 107 is not produced. Consequently, the laser annealing can be performed without considering the effect due to the reflected light from the second surface of the glass substrate 107. Moreover, since the laser beam can be incident vertically into the substrate, the rectangular laser beam formed by the diffractive optic 101 and the cylindrical lenses 102 and 103 having the uniform intensity distribution is in a completely symmetrical relation with respect to the scanning directions A and B of the glass substrate. Thus, the uniform laser annealing can be performed efficiently to the whole surface of the glass substrate 107 because the laser annealing can be performed uniformly not depending on the scanning directions A and B.

Figure 3:
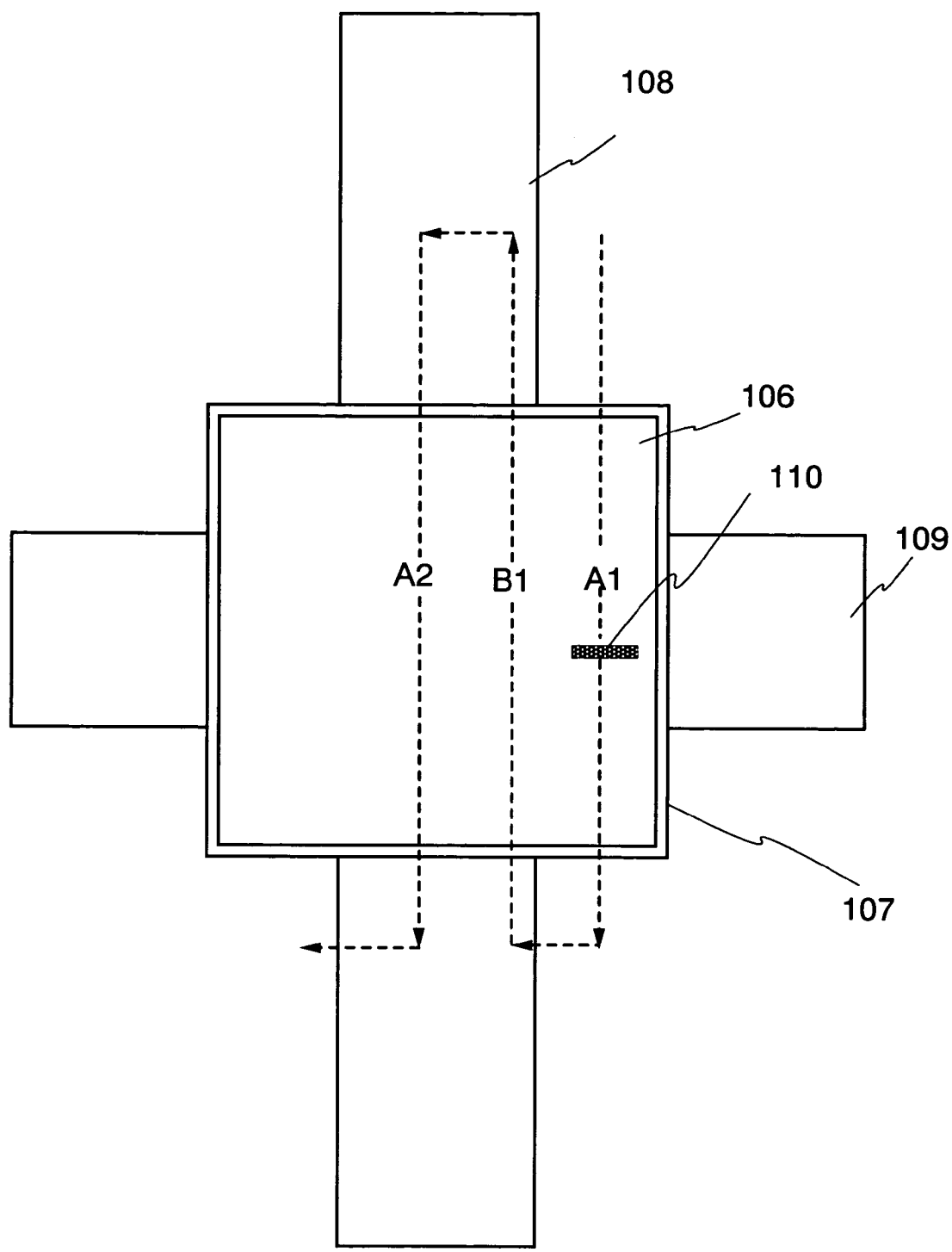
FIG. 3 is a drawing for explaining the irradiation method to crystallize the whole surface of a semiconductor film 106 and to obtain a large crystal grain region.

Next, FIG. 3 shows an irradiation method in order to crystallize the whole surface of the amorphous semiconductor film 106 and to obtain a large crystal grain region. For easy understanding, the same reference numerals as those in FIG. 1 are used in FIG. 3. The substrate 107 with the amorphous semiconductor film 106 formed thereover is fixed on a vacuum suction stage, and the laser beam is irradiated thereto. First, the X-axis stage 108 is used to scan the amorphous semiconductor film 106 in a straight line. This line corresponds to A1 in FIG. 3. In FIG. 3, after the laser beam is irradiated to a portion of outward "Am" (m is a positive integer) by the X-axis stage 108, the Y-axis stage 109 is slid in a direction perpendicular to the direction scanned by the X-axis stage 108 by the width of the large crystal grain region 110, and then the laser beam is irradiated to a portion of homeward "Bm". Repeating such round of operation crystallizes the whole surface of the amorphous semiconductor film 106 so that the large crystal grain region is obtained.

Figure 2B:
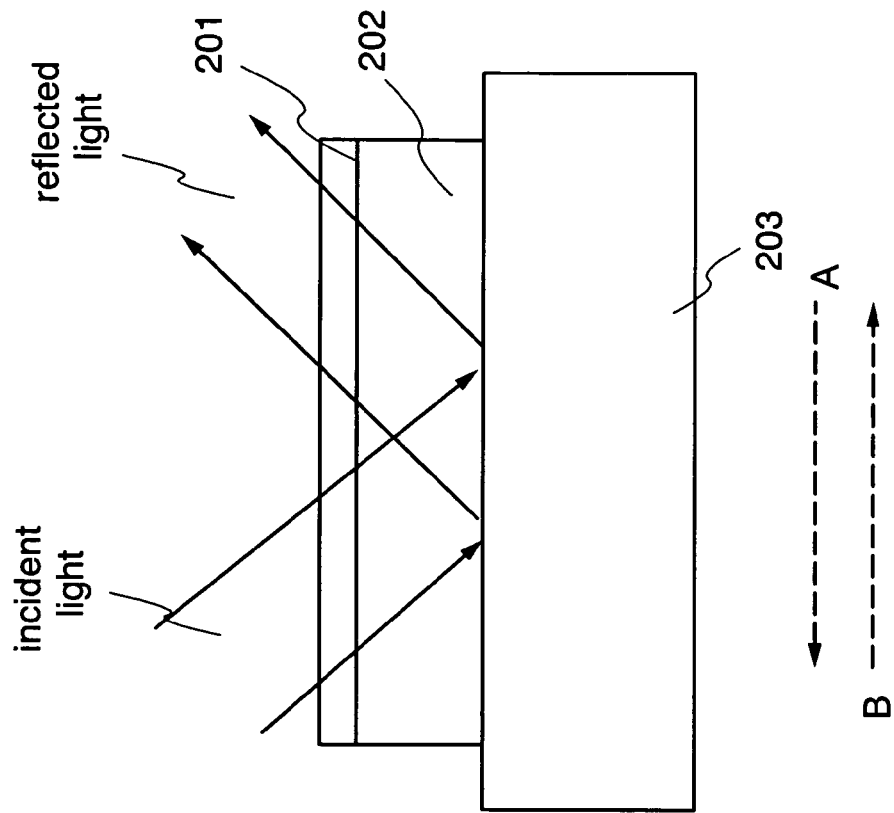
FIGS. 2A and 2B are drawings for explaining the laser annealing method where the laser beam is incident obliquely.
Figure 2A:
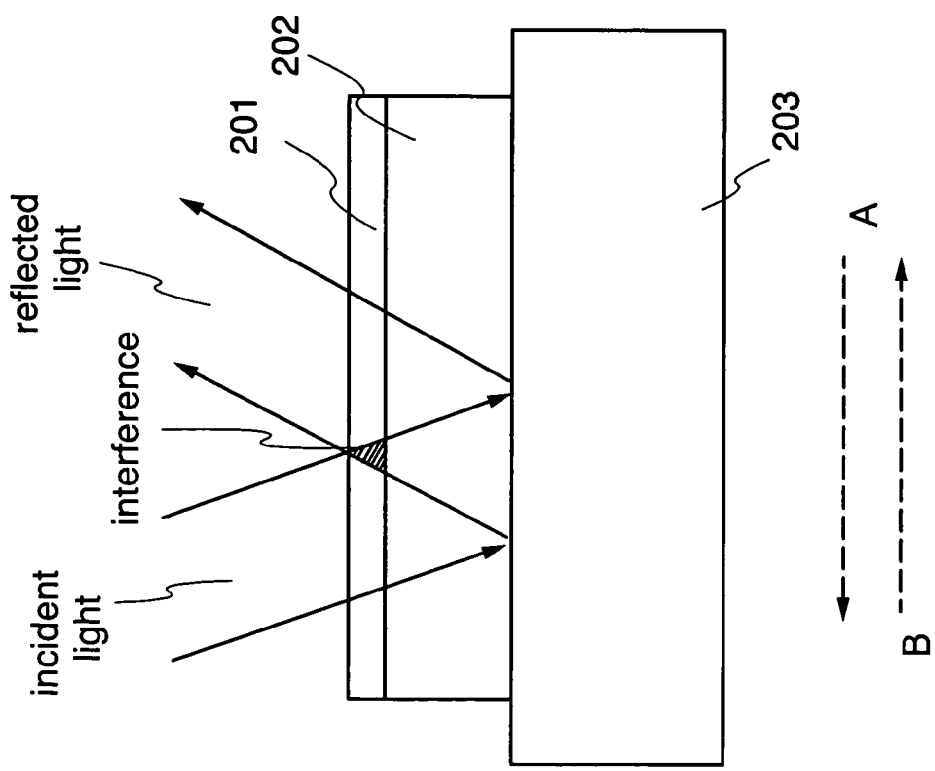

In order to prevent the interference, which causes the variation in the state of the semiconductor film, annealed by the laser beam it is effective to anneal by making the laser beam incident obliquely into the substrate. This is explained referring to FIGS. 2A and 2B. In FIGS. 2A and 2B, a substrate 202 with a semiconductor film 201 formed thereon is irradiated with a visible laser beam while moving a moving stage 203 in an A direction or a B direction. When a glass substrate is used as the substrate here, the incident light transmits through the substrate because the glass substrate is transparent. When the incident light transmits through the substrate, it is reflected on the second surface of the substrate, and then it is incident again into the semiconductor film 201. In order to prevent the interference, it is necessary to make the laser beam incident so that the incident light and the reflected light from the rear surface of the substrate do not overlap on the semiconductor film 201 as shown in FIG. 2B. In the case where an incidence angle is small as shown in FIG. 2A, the incident light and the reflected light from the second surface overlap on the semiconductor film. Therefore, even when the laser beam has uniform intensity distribution, the interference is likely to occur and the semiconductor film may not be annealed uniformly. According to the method of the laser light being incident at a large incidence angle as shown in FIG. 2B, since the incident light does not overlap with the reflected light from the second surface of the substrate on the semiconductor film, the nonuniform annealing due to the interference can be prevented. In this method, however, the large incidence angle causes a problem that it is difficult to design the optical system and to use a beam homogenizer. The beam homogenizer is an optical system such as a diffractive optic that homogenizes intensity distribution of the laser beam. As explained above, the laser beam emitted from the laser oscillator has Gaussian intensity distribution, which is not uniform distribution. Thus, in order to form the laser beam having uniform intensity distribution on the irradiated surface, it is necessary to set the beam homogenizer between the laser oscillator and the irradiated surface. The general beam homogenizer, however, is designed so that the laser beam having uniform intensity distribution is formed on the irradiated surface that is located in parallel with the beam homogenizer. Thus, when the laser beam is incident into the substrate at a large incidence angle using the general beam homogenizer, the laser beam cannot have uniform intensity distribution on the irradiated surface, and therefore the uniform annealing cannot be performed all over the substrate. However, since the laser beam can be made incident vertically into the substrate according to the present invention, the general beam homogenizer can be used to form the laser beam having uniform intensity distribution on the irradiated surface. When the laser annealing is performed using the substrate according to the present invention over which the semiconductor film is formed as the irradiated surface and using the laser beam having uniform intensity distribution, the whole surface of the substrate can be annealed uniformly.

In the irradiation method shown in FIG. 2B, there is another problem that the state of the semiconductor film annealed by moving the substrate in A direction is different from that annealed by moving the substrate in B direction. Specifically, they are different in the crystallinity, the crystal orientation, or the like. The reason is as follows. When the substrate moves in A direction, the reflected light from the second surface of the substrate is incident into a semiconductor film before the incident light. On the other hand, when the substrate moves in B direction, the incident light is incident before the reflected light from the second surface of the substrate. Since the incident light is partially reflected on the first surface of the substrate or partially passes through the second surface of the substrate, the reflected light from the second surface has lower energy than the incident light. When the substrate moves in A direction, the semiconductor film is heated by the reflected light from the second surface having low energy and then heated by the incident light having high energy. Conversely, when the substrate moves in B direction, the semiconductor film is heated by the incident light having high energy and then heated by the reflected light from the second surface having low energy. Therefore, the state of the semiconductor film differs according to whether the semiconductor film is annealed scanning in the A direction and in the B direction because the semiconductor film is heated differently. For this reason, the laser beam is scanned only in one direction in order to obtain the semiconductor film having the uniform characteristic all over the surface. In other words, the moving stage cannot be scanned back and forth in the laser annealing. Therefore, it takes much time to process one substrate, and there is a problem that the throughput is low.

However, when the laser irradiation method disclosed in the present invention is used to perform the laser annealing, the laser beam is reflected on the first surface of the substrate; the laser beam is absorbed in the substrate; or the laser beam is partially reflected on the first surface thereof and partially absorbed therein. Therefore, the intensity of the reflected light from the second surface of the substrate lowers so as not to affect the uniformity of the annealing to the semiconductor film. For this reason, it is not necessary to consider the effect of the reflected light from the second surface of the substrate. Moreover, since the semiconductor film is heated only by the incident light, the whole surface of the substrate is heated uniformly and the state of the semiconductor film after being annealed becomes uniform. Thus, the laser irradiation can be performed with scanning in both A and B directions shown in FIGS. 2A and 2B. In other words, the semiconductor film can be annealed by scanning the laser beam back and forth, thereby increasing the throughput compared with the conventional method described above. Besides, it is possible to use the componebts of this invention with the laser light being incident at a large incidence angle as shown in FIG. 2B in order to completely remove the influence of the interference.

When the laser beam is incident obliquely into the substrate as shown in FIGS. 2A and 2B, the state of the annealed semiconductor film is different according to the moving direction of the moving stage. With the present invention, however, it is possible to obtain a more uniform polycrystalline semiconductor film having a large grain size over the whole surface of the substrate even when the laser annealing is performed with scanning the laser beam in both A and B directions shown in FIGS. 2A and 2B. Therefore, since the laser annealing can be performed by moving the laser beam back and forth, the time for processing one substrate can be shortened and many substrates can be processed in a short period of time. In other words, the throughput can be increased.

Embodiment Mode 2

Figure 7:
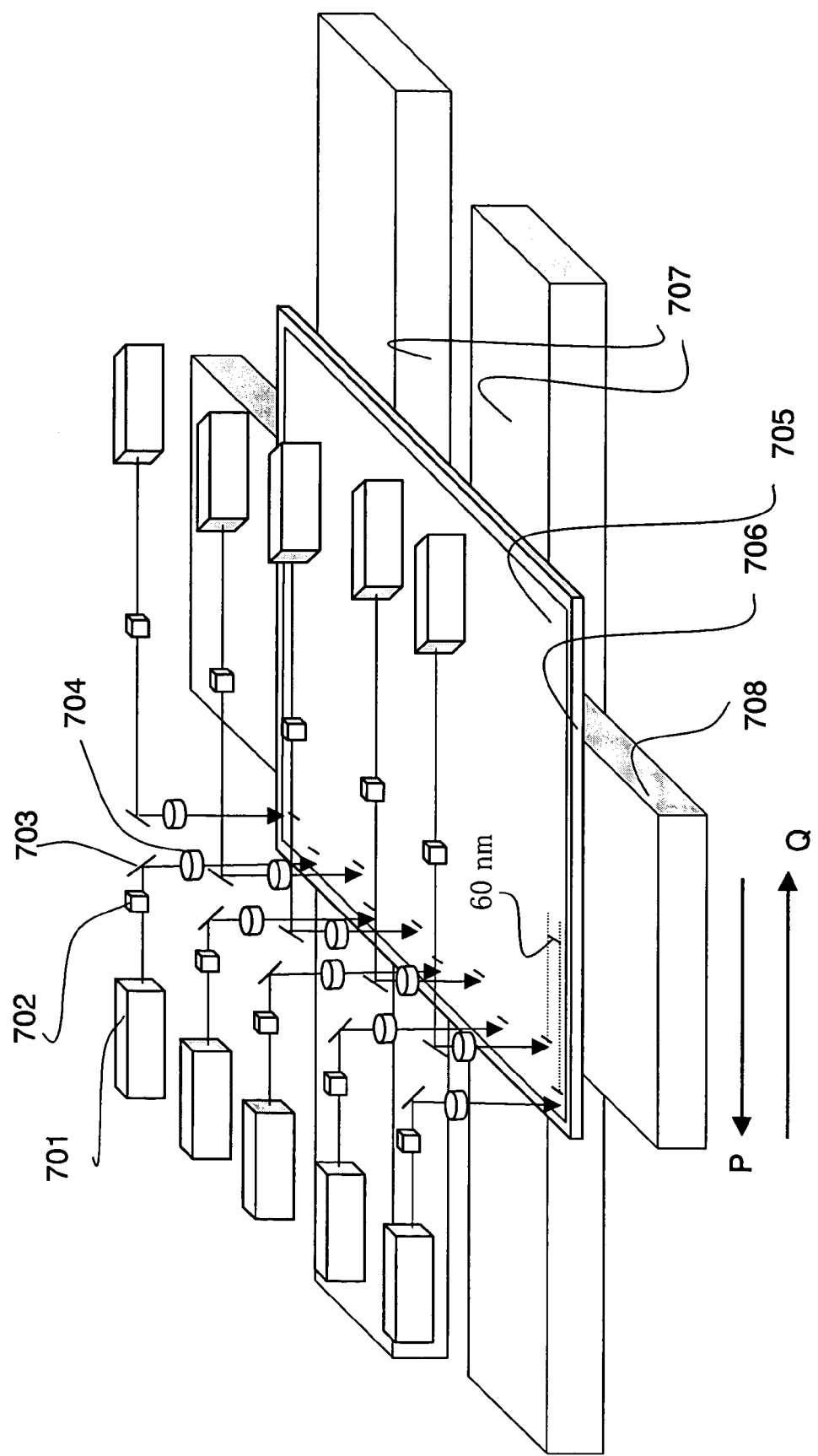
FIG. 7 is a drawing for explaining an embodiment mode 2.

The embodiment mode 2 of the present invention is explained in detail with reference to FIG. 7. FIG. 7 shows an example where laser annealing is performed to a large-sized glass substrate.

Initially, a large-sized glass substrate 706 is prepared. The large-sized glass substrate 706 includes the impurity to be opaque to the visible light as well as the colored glass substrate in the Embodiment Mode 1. Then, an amorphous semiconductor film 705 is formed over the glass substrate 706 using the known method such as a sputtering method, an LPCVD method, or a plasma CVD method, and then the laser annealing is performed to the glass substrate 706 as the irradiated surface. In addition, the semiconductor film may be crystallized before the laser annealing by performing a heat treatment after introducing a metal element or the like into the semiconductor film.

A laser oscillator 701 is a YAG laser oscillator emitting a CW laser beam or a $YVO_4$ laser oscillator emitting a second harmonic laser beam. As shown in FIG. 7, ten of the same laser oscillators are used to perform the laser annealing to the large-sized glass substrate 706. The same laser oscillators and the same optical systems are used in all the laser irradiation apparatus. Therefore, the reference numeral is not given to all of them, but one laser irradiation apparatus is taken up for an explanation.

Moreover, the reason why positions where the laser beams start to be irradiated are displaced back and forth one by one as shown in FIG. 7 is explained as follows. The distance between the center of a rectangular laser beam and the center of the next rectangular laser beam is as short as 60 mm on the amorphous semiconductor film 705, and it is difficult to arrange condenser lens 704 at this interval. Even though the arrangement of the condenser lens 704 are possible, it is predicted that such a narrow space is not enough to adjust the optical system. Therefore, it is effective to displace the irradiated positions of the laser beam back and forth one by one as shown in FIG. 7. With this arrangement, the adjacent optical systems never contact each other, and it becomes easy to arrange and adjust the optical systems. However, since the positions where the laser beam start to be irradiated are displaced back and forth, it is necessary to extend a scanning distance of the glass substrate 706 slightly in order to crystallize a whole surface of the amorphous semiconductor film 705.

A laser beam emitted from the laser oscillator 701 is shaped into a rectangular laser beam having uniform intensity distribution through a diffractive optic 702. Next, after the laser beam is reflected by a mirror 703, it is condensed by a condenser lens 704, and then the laser beam is incident vertically into the amorphous semiconductor film 705. Another laser irradiation apparatus also forms the laser beam having uniform intensity distribution, which is incident vertically into the amorphous semiconductor film 705 in the same way.

As a moving stage for moving the glass substrate 706, an X-axis stage 707 and a Y-axis stage 708 are used. Since the substrate 706 has a large size, the X-axis stage 707 has two operating shafts in order to move the substrate more stably. As explained in the embodiment mode 1 with reference to FIG. 3, after scanning the amorphous semiconductor film 705 in a straight line in a P direction by the X-axis stage 707, the Y-axis stage 708 is slid by the length of the large crystal grain region in the direction of its width in a direction perpendicular to the P direction, and then the X-axis stage 707 is scanned again in a Q direction to perform laser irradiation. Repeating such round of operations can crystallize the whole surface of the amorphous semiconductor film 705 so that a large crystal grain region is obtained.

Although ten of the laser irradiation apparatus are used to perform laser annealing in the present embodiment, even a half of them, which means five laser irradiation apparatus, or twice as many as them, which means twenty laser irradiation apparatus, can be also used to perform laser annealing according to the present invention. Thus, the amorphous semiconductor film formed over the large-sized substrate can be crystallized to obtain a large crystal grain region. When TFT is manufactured using the semiconductor film, the mobility increases remarkably compared with that formed using the conventional crystalline semiconductor film. Therefore, the TFT manufactured by the present invention can be also applied to the semiconductor device requiring high-speed operation.

Embodiment 1

Figure 5A:
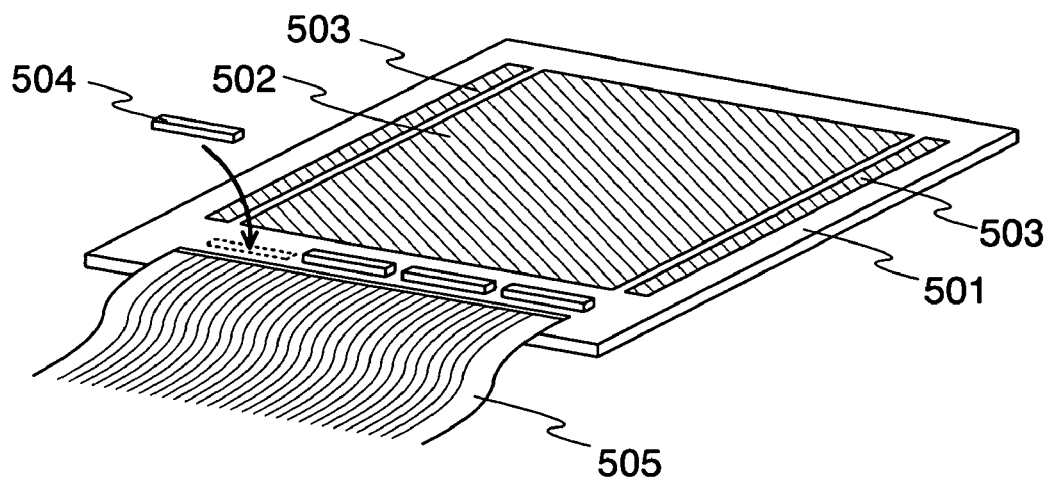
FIGS. 5A and 5B are drawings for explaining how to mount the thin film chip on the substrate with the pixel portion formed thereon in an embodiment 1.
Figure 5B:
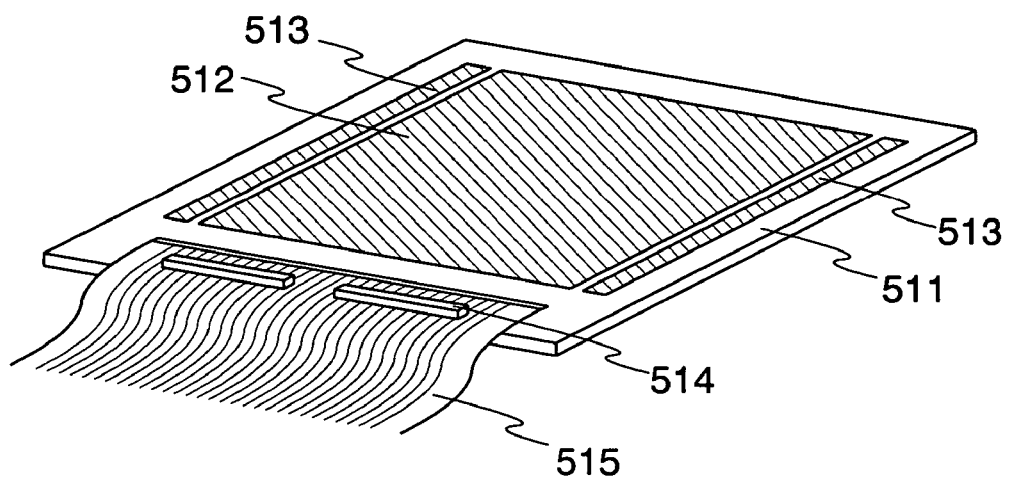
Figure 6:
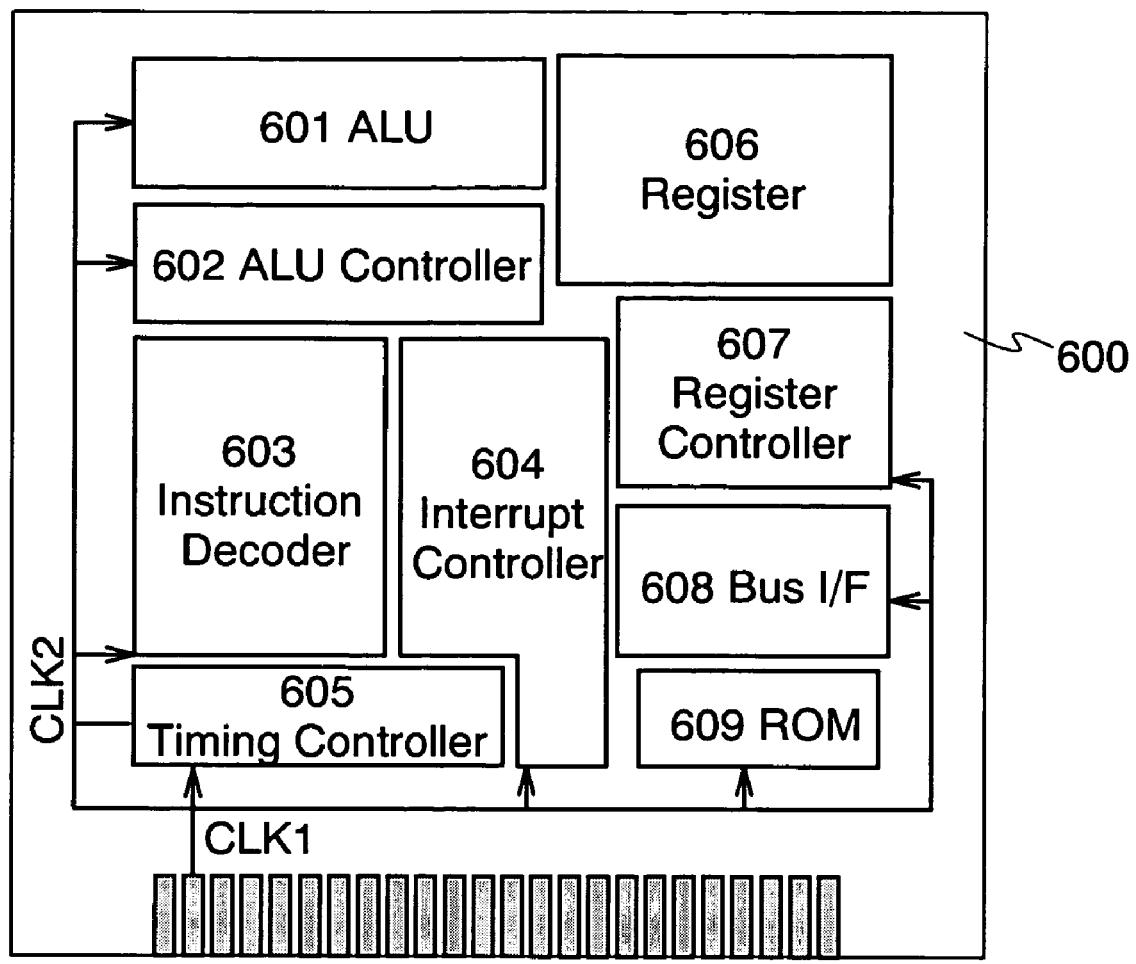
FIG. 6 is a drawing for explaining a CPU in an embodiment 2.

The present embodiment explains a process to manufacture a thin film chip using the substrate manufactured by the method explained in the embodiment mode 2 and to mount the thin film chip on the substrate with the pixel portion formed therein with reference to FIGS. 5 and 6.

Figure 4A:
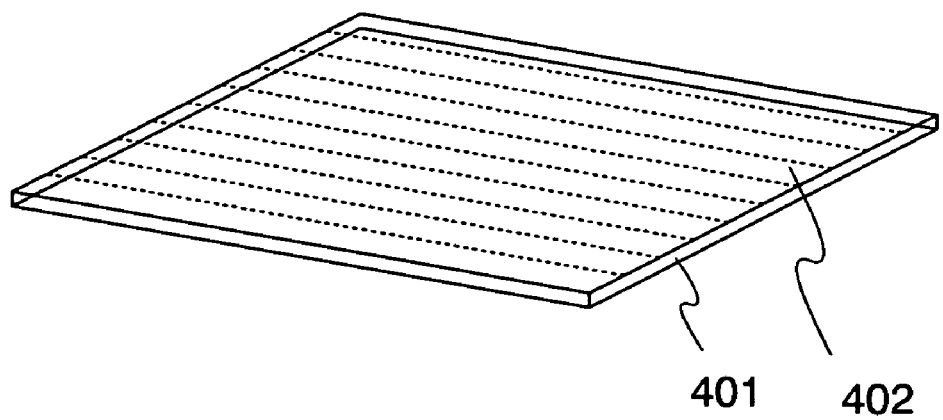
FIGS. 4A and 4B are drawings for explaining a thin film chip in an embodiment 1.
Figure 4B:
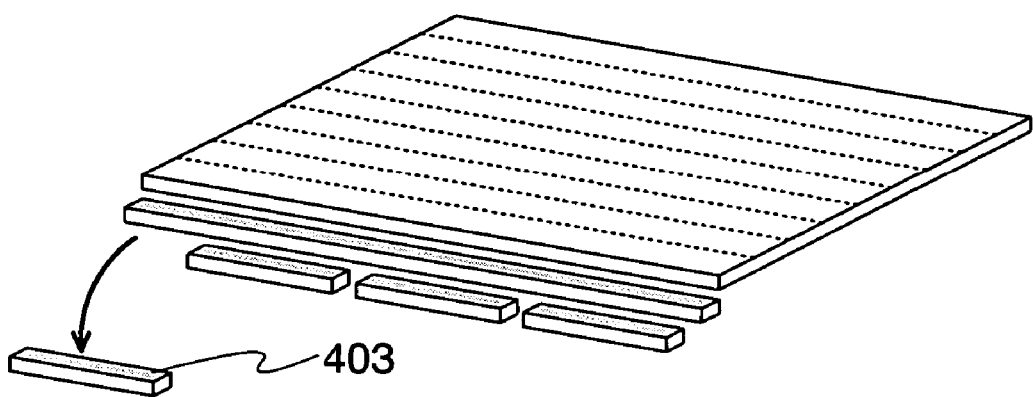

First, a poly-crystalline semiconductor thin film formed over a substrate that is obtained by performing the laser annealing according to the embodiment mode 2 is prepared. FIG. 4A shows a substrate 401 and a semiconductor film 402 formed on the substrate 401 after being annealed by the laser beam. Then, the crystallized semiconductor film 402 on the substrate 401 is patterned and a gate electrode, a mask, and the like are formed and etched. After that, a doping is performed. It is noted that the semiconductor film may be patterned before being crystallized by the laser beam, or may be patterned after being crystallized. And then, a plurality of integrated circuits is formed on the substrate by activating the dopant and by forming each insulating film, a wiring, and the like. In this process, by using the substrate made of glass or ceramic, the substrate can have a size in meters, which is much larger than a silicon substrate or an SOI substrate. Therefore, the number of the integrated circuits obtained from one substrate can increase. The present invention is thus suitable for mass production because the throughput is expected to increase. And, after the integrated circuit is formed, a thin film chip 403 in which each of the plurality of integrated circuits is parted is formed by dividing the substrate 401.

Next, FIGS. 5A and 5B show how to mount the thin film chip formed by the above manufacturing method on the substrate where the pixel portion is formed. In FIG. 5A, a pixel portion 502 and scanning line driver circuits 503 are formed on a substrate 501. And, a signal line driver circuit formed in the thin film chip 504 is mounted on the substrate 501. Specifically, the signal line driver circuit formed in the thin film chip 504 is pasted to the substrate 501 so as to connect with the pixel portion 502 electrically. Moreover, a reference numeral 505 denotes an FPC. A power supply potential, each kind of signal, and the like are supplied respectively to the pixel portion 502, the scanning line driver circuits 503, and the signal line driver circuit formed in the thin film chip 504 through the FPC 505.

In FIG. 5B, a pixel portion 512 and scanning line driver circuits 513 are formed on a substrate 511. And, a signal line driver circuit formed in the thin film chip 514 is mounted on an FPC 515, which is mounted on the substrate 511. The power supply potential, each kind of signal, and the like are supplied respectively to the pixel portion 512, the scanning line driver circuits 513, and the signal line driver circuit formed in the thin film chip 514 through the FPC 515.

The method for mounting the thin film chip is not limited in particular, and the known COG method, wire bonding method, or TAB method can be used. In addition, the position on which the thin film chip is mounted is not limited to those shown in FIGS. 5A and 5B when the electrical connection is possible. Moreover, although FIGS. 5A and 5B show the example where only the signal line driver circuit is formed by the thin film chip, the scanning line driver circuit may be formed by the thin film chip. In addition, a controller, a CPU (Central Processing Unit), a memory, or the like may be formed by the thin film chip and the thin film chip may be mounted on the substrate. Moreover, not the whole signal line driver circuit and scanning line driver circuit but only a part of the circuit constituting each driver circuit may be formed by the thin film chip.

In the semiconductor display device where the driver circuit is mounted as the thin film chip, the transistor used in the pixel portion is not limited to the TFT formed using the amorphous semiconductor film such as amorphous silicon. The transistors in the pixel portion may be TFTs formed using a micro-crystal semiconductor film or a poly-crystalline semiconductor film. Besides, TFTs formed using a single-crystal silicon or TFTs formed using SOI may be employed. Furthermore, TFTs formed using an organic semiconductor and the transistor formed using a carbon nanotube may be also used. Compared with the case where all the circuits are formed on the same substrate, the yield can be boosted when the integrated circuit such as the driver circuit is formed separately in thin film chip and mounted on the substrate. Therefore, it is possible to optimize the process easily in accordance with the characteristic of each circuit.

Embodiment 2

The present embodiment explains the structure of a CPU (Central Processing Unit) manufactured using a poly-crystalline semiconductor thin film on the substrate formed according to the method explained in the embodiment mode 1.

FIG. 6 shows the structure of a CPU of the present embodiment. The CPU shown in FIG. 6 has an ALU (Arithmetic Logical Unit) 601, an ALU controller 602, an instruction decoder 603, an interrupt controller 604, a timing controller 605, a resister 606, a resister controller 607, a Bus I/F (Bus Interface) 608, and a ROM (Read Only Memory) 609. Of course, the CPU shown in FIG. 6 is just an example in which the structure is simplified, and the CPU to be used in fact has various structures according to the application.

An instruction input into the CPU through the Bus I/F 608 is input into the instruction decoder 603. After the instruction is decoded thereby, it is input into the ALU controller 602, the interrupt controller 604, the register controller 607, and the timing controller 605.

The ALU controller 602, the interrupt controller 604, the resister controller 607, and the timing controller 605 operate based on the decoded instructions. Specifically, the ALU controller 602 generates the signal for controlling the operation of the ALU 601. The interrupt controller 604 handles the interrupt request from the external input-output device or from the peripheral circuit by judging from the priority or the mask condition during the execution of the program by the CPU. The resister controller 607 generates an address of the resister 606, and reads and writes the resister 606 according to the state of the CPU.

The timing controller 605 generates the signal for controlling the timing to operate the ALU 601, the ALU controller 602, the instruction decoder 603, the interrupt controller 604, and the resister controller 607. For example, the timing controller 605 is equipped with an internal clock generator for generating an internal clock signal CLK2 based on a standard clock signal CLK1 and supplies the clock signal CLK2 to the above circuits. In the ROM 609, each program to be executed is input.

In addition, although the present embodiment explains an example of CPU, the semiconductor device of the present invention is not limited to CPU. It is noted that by using the glass substrate or the ceramic substrate as well as in the embodiment 1, it is possible to manufacture many CPUs on one piece of large-sized substrate, thereby being suitable for mass production.

What is claimed is:

1. A semiconductor device comprising:
a crystalline semiconductor film over a surface of a substrate,
wherein an absorption coefficient $\alpha$ of the substrate to a light satisfies an inequality of $\alpha \geqq \ln 10/2d$ where d is a thickness of the substrate, where the light is capable of being absorbed by the crystalline semiconductor film and partially transmitting through the crystalline semiconductor film to reach the surface of the substrate.

2. The semiconductor device according to claim 1, wherein a wavelength of the light is same as a laser light used to crystallize the crystalline semiconductor film.

3. The semiconductor device according to claim 1, wherein the light is a visible light.

4. The semiconductor device according to claim 1, wherein the substrate is an insulator.

5. A semiconductor device comprising:
a substrate having a first surface and a second surface; and
a crystalline semiconductor film over the first surface of the substrate,
wherein a light is partially reflected on the first surface of the substrate, and
wherein a ratio of the light reflected on the second surface of the substrate is 0.4% or less.

6. The semiconductor device according to claim 5, wherein a wavelength of the light is same as a laser light used to crystallize the crystalline semiconductor film.

7. The semiconductor device according to claim 5, wherein the light is a visible light.

8. The semiconductor device according to claim 5, wherein the substrate is an insulator.

9. A semiconductor device comprising:
a crystalline semiconductor film over a surface of a substrate,
wherein an absorption coefficient $\alpha$ of the substrate to a light satisfies an inequality of $\alpha \geqq \ln 10/2d$ where d is a thickness of the substrate, where the light is capable of being absorbed by the crystalline semiconductor film and partially transmitting through the crystalline semiconductor film to reach the surface of the substrate, and
wherein the substrate comprises a material which is opaque to the light.

10. The semiconductor device according to claim 9, wherein a wavelength of the light is same as a laser light used to crystallize the crystalline semiconductor film.

11. The semiconductor device according to claim 9, wherein the light is a visible light.

12. The semiconductor device according to claim 9, wherein the substrate is an insulator.

13. The semiconductor device according to claim 9, wherein the substrate is a colored glass substrate.

14. A semiconductor device comprising:
a semiconductor film over a surface of a substrate,
wherein an absorption coefficient $\alpha$ of the substrate to a light satisfies an inequality of $\alpha \geqq \ln 10/2d$ where d is a thickness of the substrate, where the light is capable of being absorbed by the semiconductor film and partially transmitting through the semiconductor film to reach the surface of the substrate.

15. The semiconductor device according to claim 14, wherein a wavelength of the light is same as a laser light used to crystallize the semiconductor film.

16. The semiconductor device according to claim 14, wherein the light is a visible light.

17. The semiconductor device according to claim 14, wherein the substrate is an insulator.

* * * * *